(12) United States Patent
Torrents Abad et al.

(10) Patent No.: US 11,756,810 B1
(45) Date of Patent: Sep. 12, 2023

(54) DETECTION OF FORCE APPLIED BY PICK-UP TOOL FOR TRANSFERRING SEMICONDUCTOR DEVICES

(71) Applicant: Meta Platforms Technologies, LLC, Menlo Park, CA (US)

(72) Inventors: Oscar Torrents Abad, Cork (IE); Daniel Brodoceanu, Cork (IE); Ali Sengül, Zurich (CH); Pooya Saketi, Cork (IE)

(73) Assignee: Meta Platforms Technologies, LLC, Menlo Park, CA (US)

( * ) Notice: Subject to any disclaimer, the term of this patent is extended or adjusted under 35 U.S.C. 154(b) by 668 days.

(21) Appl. No.: 16/728,677

(22) Filed: Dec. 27, 2019

(51) Int. Cl.
*H01L 21/67* (2006.01)
*B25J 15/00* (2006.01)
*B65G 47/90* (2006.01)
*B81C 1/00* (2006.01)
*B25J 7/00* (2006.01)
*B81B 3/00* (2006.01)

(52) U.S. Cl.
CPC ........ *H01L 21/67144* (2013.01); *B65G 47/905* (2013.01); *B81C 1/00142* (2013.01); *B81C 1/0015* (2013.01); *H01L 21/67253* (2013.01); *H01L 21/67259* (2013.01); *B25J 7/00* (2013.01); *B81B 3/0035* (2013.01); *B81B 2203/0109* (2013.01); *B81B 2203/0145* (2013.01)

(58) Field of Classification Search
CPC .................. H01L 21/67144; B25J 15/0085
See application file for complete search history.

(56) References Cited

U.S. PATENT DOCUMENTS

| | | | |
|---|---|---|---|
| 6,954,272 B2 | 10/2005 | Lam et al. | |
| 11,004,721 B2 | 5/2021 | Hsiang et al. | |
| 2003/0030452 A1* | 2/2003 | Okada et al. | H03K 17/975 324/681 |
| 2003/0133116 A1* | 7/2003 | Lam et al. | G01B 11/272 356/401 |

(Continued)

FOREIGN PATENT DOCUMENTS

| | | |
|---|---|---|
| EP | 3425618 A1 | 1/2019 |
| JP | 2011086698 A | 4/2011 |

(Continued)

OTHER PUBLICATIONS

Non - Final Office Action mailed May 5, 2022 for U.S. Appl. No. 16/682,545, filed Nov. 13, 2019, 13 pages.

(Continued)

*Primary Examiner* — Moazzam Hossain
(74) *Attorney, Agent, or Firm* — Fenwick & West LLP (57) ABSTRACT

A pick-up head picks up a semiconductor device from a carrier substrate. The pick-up head includes a first leg portion, a second leg portion, a raised bridge base portion between the first and second leg portions, and a tip portion mounted on the raised bridge base portion. The tip portion engages with the semiconductor device to pick up the semiconductor device from the carrier substrate. The pick-up head is associated with a force detection mechanism that detects a force applied to the pick-up head for picking up the semiconductor device. The force detection mechanism includes cavities formed on the first leg portion and/or second leg portion, pillars arranged on the pick-up head, a force detection device arranged in a mount assembly that is attached on the pick-up head, or electrodes arranged on the mount assembly. Actuation of the pick-up head is determined based on the detected force.

19 Claims, 11 Drawing Sheets

(56) References Cited

U.S. PATENT DOCUMENTS

| | | | |
|---|---|---|---|
| 2004/0252251 A1* | 12/2004 | Credelle et al. | ... H01L 29/0657 257/E29.022 |
| 2010/0123268 A1 | 5/2010 | Menard | |
| 2012/0126395 A1 | 5/2012 | Lee et al. | |
| 2013/0300812 A1 | 11/2013 | Bibl et al. | |
| 2014/0324221 A1* | 10/2014 | Chisholm et al. | H01L 21/68742 700/260 |
| 2015/0268026 A1* | 9/2015 | Sugawara et al. | ....... G01B 7/02 33/568 |
| 2015/0360940 A1 | 12/2015 | Bathurst et al. | |
| 2017/0141115 A1 | 5/2017 | Bower et al. | |
| 2018/0158704 A1 | 6/2018 | Saketi et al. | |
| 2018/0158706 A1 | 6/2018 | Hsu et al. | |
| 2018/0342643 A1* | 11/2018 | Lu et al. | ................ H01L 33/00 |
| 2019/0206714 A1* | 7/2019 | Hsiang et al. | ... H01L 21/68707 |
| 2019/0339143 A1* | 11/2019 | Järvinen et al. | ....... G01L 1/146 |
| 2022/0260434 A1* | 8/2022 | Turunen et al. | ....... G01L 1/146 |

FOREIGN PATENT DOCUMENTS

TW          I633618 B    8/2018

OTHER PUBLICATIONS

PCT International Search Report and Written Opinion, PCT Application No. PCT/US2020/029088, Oct. 16, 2020 13 pages.

* cited by examiner

DETECTION OF FORCE APPLIED BY PICK-UP TOOL FOR TRANSFERRING SEMICONDUCTOR DEVICES

BACKGROUND

Field of the Disclosure

The present disclosure generally relates to transferring small semiconductor devices, and specifically to detection of force applied by a pick-up tool (PUT) for transferring small semiconductor devices.

Description of the Related Arts

There is a need to transfer small semiconductor devices, e.g., from a native substrate on which they have been manufactured or a temporary carrier substrate to a target substrate. Small semiconductor devices may be assembled with a defined separation distance between them or closely packed together on the target substrate. Because of the small size of these devices, conventional pick and place techniques are unsuitable. For example, it is difficult for conventional techniques to control forces applied on small semiconductor devices during transfer of these devices.

SUMMARY

Embodiments relate to a system that includes a pick-up tool (PUT) and a force detection device. The PUT transfers semiconductor devices. For example, the PUT can transfer very small light emitting diodes (LEDs) (e.g., µLEDs that may have diameters or widths smaller than 100 µm) from a native substrate on which they have been manufactured or a temporary carrier substrate to a target substrate that forms part of the display, or "display substrate." The PUT includes a first leg portion, a second leg portion, a bridge base portion between the first leg portion and the second leg portion, and a tip mounted on the bridge base portion. The tip engages with the semiconductor device. The PUT can apply a force on the semiconductor device during transfer. The force detection device detects the force applied by the PUT onto the semiconductor devices, e.g., based on optical or electrical signals.

In some embodiments, the force detection device includes an imaging assembly and a controller. The imaging assembly captures one or more images of a structure that is formed within at least in the first leg portion or the second leg portion of the PUT and deformable under the force applied by the PUT. The controller receives the one or more images, analyzes deformation of the deformable structure based on the one or more images, and determines the force applied by the PUT based on the deformation.

In some other embodiments, the force detection device includes a force detection sensor. The force detection sensor is arranged on or in a mounting assembly on which the PUT is mounted. The processing device receives a sensing signal from the force detection sensor, and processes the sensing signal to determine the force applied by the PUT.

In yet some other embodiment, the force detection device includes a pair of electrodes, a capacitance measuring device, and a controller. One of the electrodes is placed on a first surface of a substrate of the PUT, the other electrode is placed on a second surface of the substrate of the PUT. The second surface of the substrate opposes the first surface of the substrate. The capacitance measuring device measures a capacitance between the first electrode and the second electrode. The controller determines the force applied by the PUT based on the capacitance.

BRIEF DESCRIPTION OF THE DRAWINGS

Figure (FIG. ) 1 is a schematic view of a display assembly system, in accordance with one embodiment.

The figures depict embodiments of the present disclosure for purposes of illustration only.

DETAILED DESCRIPTION

In the following description of embodiments, numerous specific details are set forth in order to provide more thorough understanding. However, note that the embodiments may be practiced without one or more of these specific details. In other instances, well-known features have not been described in detail to avoid unnecessarily complicating the description.

Embodiments are described herein with reference to the figures where like reference numbers indicate identical or functionally similar elements. Also in the figures, the left most digits of each reference number correspond to the figure in which the reference number is first used.

Embodiments relate to detection of a force applied by a pick-up tool (PUT) for transferring semiconductor devices (such as LEDs). In some embodiments, the PUT includes a first leg portion, a second leg portion, a bridge base portion between the first leg portion and the second leg portion, and a tip mounted on the bridge base portion. The tip engages with a semiconductor device, e.g., for picking up the semiconductor device from a carrier substrate or placing and bonding the semiconductor device on the target substrate. The PUT applies a force on the semiconductor device during the transfer for bonding the semiconductor device, e.g., with the tip of the PUT or the target substrate. A force detection device detects the force applied by the PUT based on optical or electrical signals. For example, the force detection device can detect the force based on images of a structure that deforms under the force. As another example, force detection device can detect the force based on signals from a sensor arranged on or in the PUT.

Figure 1:
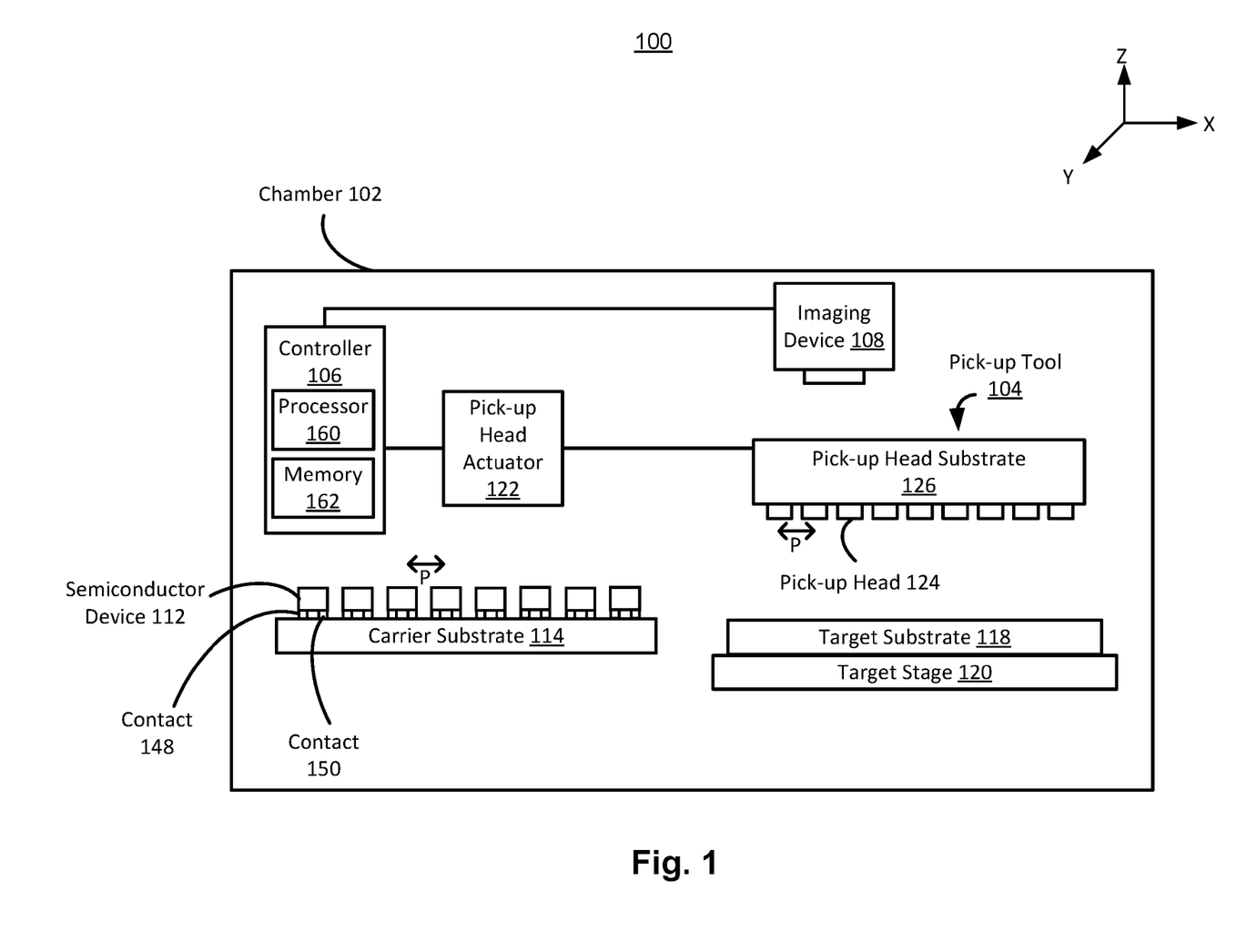

FIG. 1 is a schematic view of a display assembly system 100, in accordance one embodiment. The display assembly system 100 transfers semiconductor devices 112 from a carrier substrate 114 to a target substrate 118.

In some embodiments, the semiconductor devices 112 are light emitting diodes (LEDs) that emit the same color or different colors. The carrier substrate 114 may be a temporary carrier that holds the LEDs for pick up by the PUT 104. The target substrate 118 may be a display substrate of a display device including control circuits for the LEDs. The display assembly system 100 places LEDs at pixel locations of the display substrate, and then bonds the LEDs to the display substrate. In some embodiments, the semiconductor devices 112 are µLEDs having a diameter or width smaller than 100 µm, a reduced divergence of light output, and small light emitting area. In some embodiments, the µLEDs have feature size (e.g., the diameter) and pitch (e.g., the spacing between µLEDs on the target substrate 118 or carrier substrate 114) in the sub-micron (e.g., ~0.1 um) to 10 um range. In other embodiments, the semiconductor devices 112 are vertical-cavity surface-emitting lasers (VCSELs).

The display assembly system 100 includes a chamber 102 defining an interior environment for transferring semiconductor devices 112, a PUT 104, a force detection device (not shown in FIG. 1) mounted in or on the PUT 104, a controller 106, an imaging device 108, a pick-up head actuator 122, and a target stage 120.

The PUT 104 includes an array of pick-up heads 124 and a pick-up head substrate 126 on which the pick-up heads 124 are attached. Each pick-up head 124 may pick up a semiconductor device 112 from the carrier substrate 114, and place the semiconductor device 112 on the target substrate 118. In some embodiments, each pick-up head 124 includes a conformable tip that adheres with a semiconductor device 112. The PUT 104 may support selective, parallel pick up and placement of multiple semiconductor devices 112 via adhesive attachment with the pick-up heads 124. In some embodiments, the display assembly system 100 includes a single pick-up head 124 rather than an array.

After picking up a semiconductor device 112, the pick-up head 124 is aligned with a target location on the target substrate 118 to place the semiconductor device 112 on the target substrate 118. The PUT 104 applies a force on the semiconductor device 112 during the transfer, e.g., for bonding the semiconductor device 112 to the tip of the pick-up head 124 and/or the target substrate 118.

The force detection device detects the force applied by the PUT 104 (or the pick-up head 124 of the PUT 104) to the semiconductor device. The force detection device generates one or more force detection signals. Examples of the force detection signals include image of deformable structures formed within the PUT 104 that is captured by an imaging device (e.g., the imaging device 108), output signal of a piezoresistive sensor, output signal of a strain gauge, capacitance of the pick-up head substrate 126, or some combination thereof. A controller 106, receives the force detection signals and determines the force applied by the PUT based on the force detection signals.

The controller 106 is coupled to the imaging device 108 and the PUT 104 via the pick-up head actuator 122, and controls the operation of these components. For example, the controller 106 further causes the PUT 104 to pick up one or more semiconductor devices 112 located on the carrier substrate 114 via adhesive attachment, and place the one or more semiconductor devices 112 on the target substrate 118. As another example, the controller 106 instructs the PUT 104 and/or the pick-up head actuator 122 to cause the PUT 104 to apply a force or adjust a force applied to a semiconductor device for transferring the semiconductor device.

In some embodiments, the controller 106 includes a processor 160 and a memory 162. The memory 162 may be a non-transitory computer-readable storage medium storing instructions that when executed by the processor 160 causes the processor 160 to perform the functionality discussed herein, such as by controlling the other components of the display assembly system 100. In some embodiments, the controller 106 may include an application specific integrated circuit (ASIC), field programmable gate array (FPGA), or other type of processing circuitry.

The pick-up head actuator 122 is an electro-mechanical component that controls the movement of the PUT 104 based on control signals from the controller 106. For example, the pick-up head actuator 122 may move the PUT 104, or individual pick-up heads 124, with multiple degrees of freedom including up and down, left and right, forward and back, and rotation along X, Y, and Z axes. The pick-up head actuator 122 can cause the PUT 104, or an individual pick-up head 124 to apply a force on a semiconductor device for transferring the semiconductor device. In some embodiments, the pick-up head actuator 122 may include a rotating motor, a linear motor, and/or a hydraulic cylinder.

The imaging device 108 facilitates visual alignment for pick-up of the semiconductor devices 112 from the carrier substrate 114 and placement of the semiconductor devices 112 on the target substrate 118. The PUT 104 may be formed from transparent materials such that the substrates 114, 118 and semiconductor devices 112 are visible through the PUT 104. In some embodiments, the imaging device 108 is attached with the PUT 104.

The imaging device 108 generates images of the PUT 104 and the carrier substrate 114, and provides the images to the controller 106. The controller 106 aligns the one or more pick-up heads 124 of the PUT 104 with the one or more semiconductor devices 112 on the carrier substrate 114 based on the images, and picks up one or more semiconductor devices 112.

In another example, the imaging device 108 generates images of the one or more pick-up heads 124 of the PUT 104 and the target substrate 118, and provides the images to the controller 106. The controller 106 aligns the one or more pick-up heads 124 with the display substrate 118 based on the images, and places the one or more semiconductor devices 112 attached to the one or more pick-up heads 124 on the display substrate 118.

The display assembly system 100 may include multiple imaging devices, such as an imaging device pointed at the carrier substrate 114 and an imaging device pointed at the target substrate 118. The display assembly system 100 may include one or more carrier substrates 114. For example, different carrier substrates 114 may carry different color LEDs. A carrier substrate 114 may hold singulated semiconductor devices 112 for transfer a target substrate 118. The display assembly system 100 may further include one or more target substrates 118. In some embodiments, such as when the target substrate 118 is a display substrate for receiving the semiconductor devices 112, the system includes a target stage 120 with a heater for thermal compression (TC) bonding of electrical contacts 148 and 150 of the semiconductor devices 112 to contacts of the target substrate 118. The heater may supply heat in connection with the PUT 104 applying a force on the semiconductor devices 112 toward the target substrate 118. In some embodiments, the target stage 120 provides laser-assisted bonding (LAB) of the electrical contacts 148 and 150.

Figure 2:
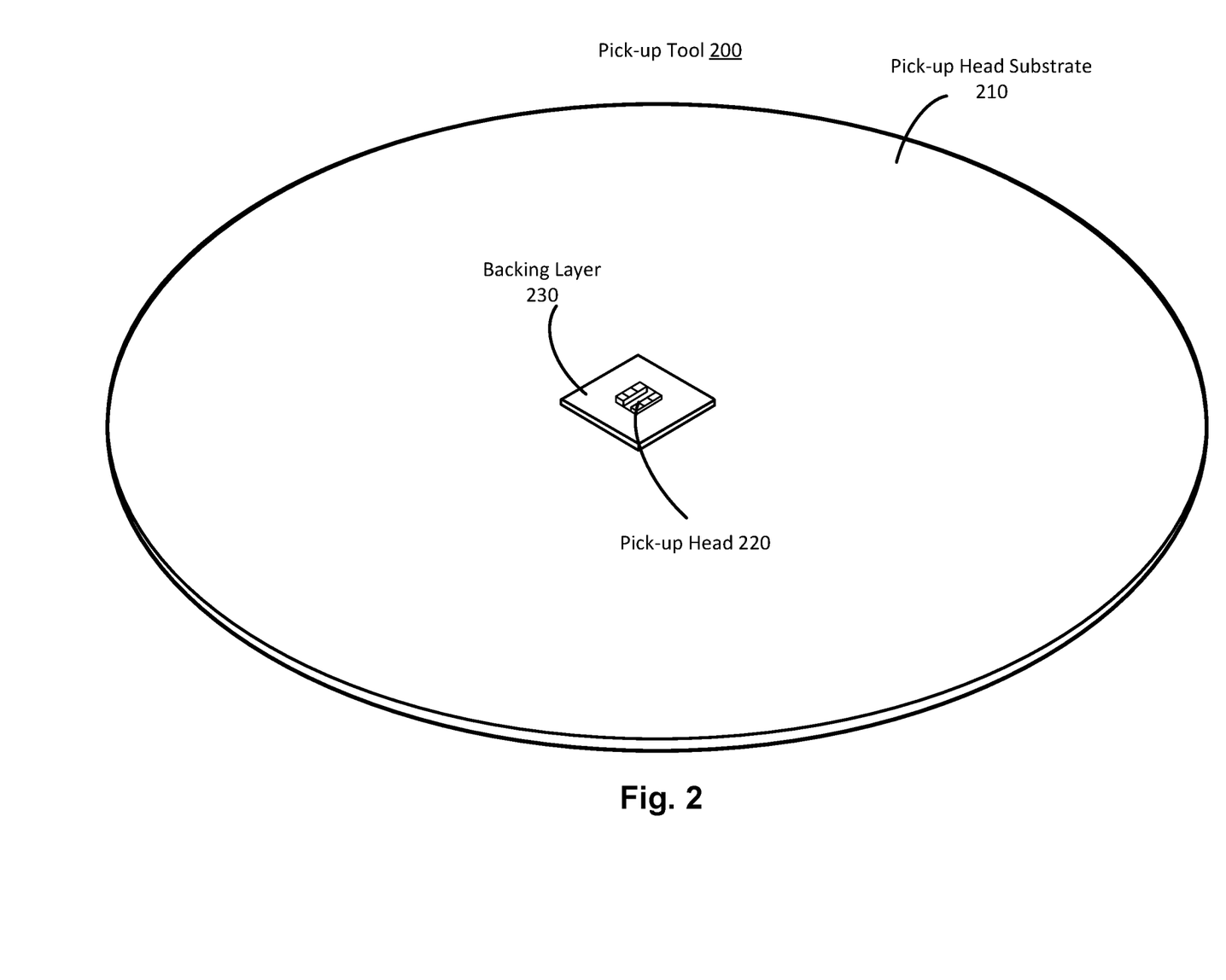
FIG. 2 is a diagram illustrating a perspective view of a pick-up tool (PUT), in accordance with one embodiment.

FIG. 2 is a diagram illustrating a perspective view of a PUT 200, in accordance with one embodiment. The PUT 200 can be an embodiment of the PUT 104 in FIG. 1. The PUT 200 includes a pick-up head substrate 210, a pick-up head 220, and a backing layer 230 between the pick-up head substrate 210 and the pick-up head 220.

The pick-up head substrate 210 and/or the backing layer 230 provides a support structure for one or more pick-up heads 220. The pick-up head substrate 210 may be formed from a transparent, rigid material, such as a fused silica wafer. The backing layer 230 may be formed from a transparent, conformable material. In some embodiments, the backing layer 230 is formed from an elastomer, such as polydimethylsiloxane (PDMS).

The pick-up head 220 provides a surface for adhesive attachment with a semiconductor device. The pick-up head 220 may be formed from a transparent, conformable material that provides adhesion with the semiconductor device. In some embodiments, the pick-up head 220 is formed from an elastomer that is transparent and provides enough adhesion material, such as polydimethylsiloxane (PDMS). In some embodiments, the pick-up head 220 provides attachment with one or more semiconductor devices 112 via covalent bonding or Van der Waals bonding. The pick-up head 220 can be released from the one or more semiconductor devices 112 through a de-bonding process, e.g., through a laser de-bonding process or wet etch process.

The pick-up head substrate 210, backing layer 230, and pick-up head 220 may each be transparent to light to allow visibility through the PUT 200 to facilitate alignment during pick and place operations for the semiconductor devices 112 and/or facilitate capturing light reflected from a deformable structured formed within the pick-up head 220.

Although a single pick-up head 220 and backing layer 230 is shown in FIG. 2, the PUT 200 may include an array of pick-up heads 220 and backing layers 224 for facilitating parallel pick and place using the imaging device 108.

Figure 3A:
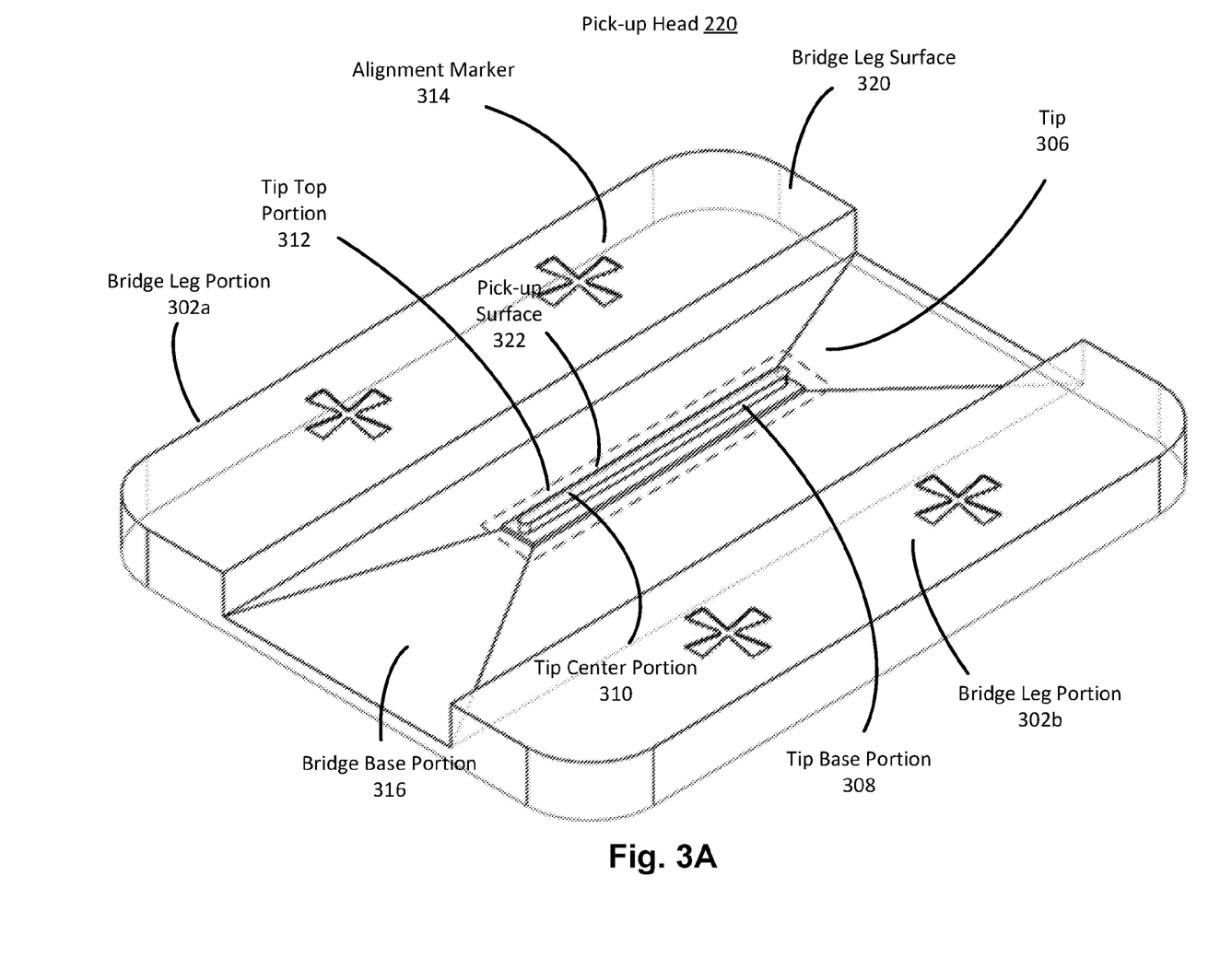
FIG. 3A is a diagram illustrating a perspective view of a pick-up head, in accordance with one embodiment.
Figure 3B:
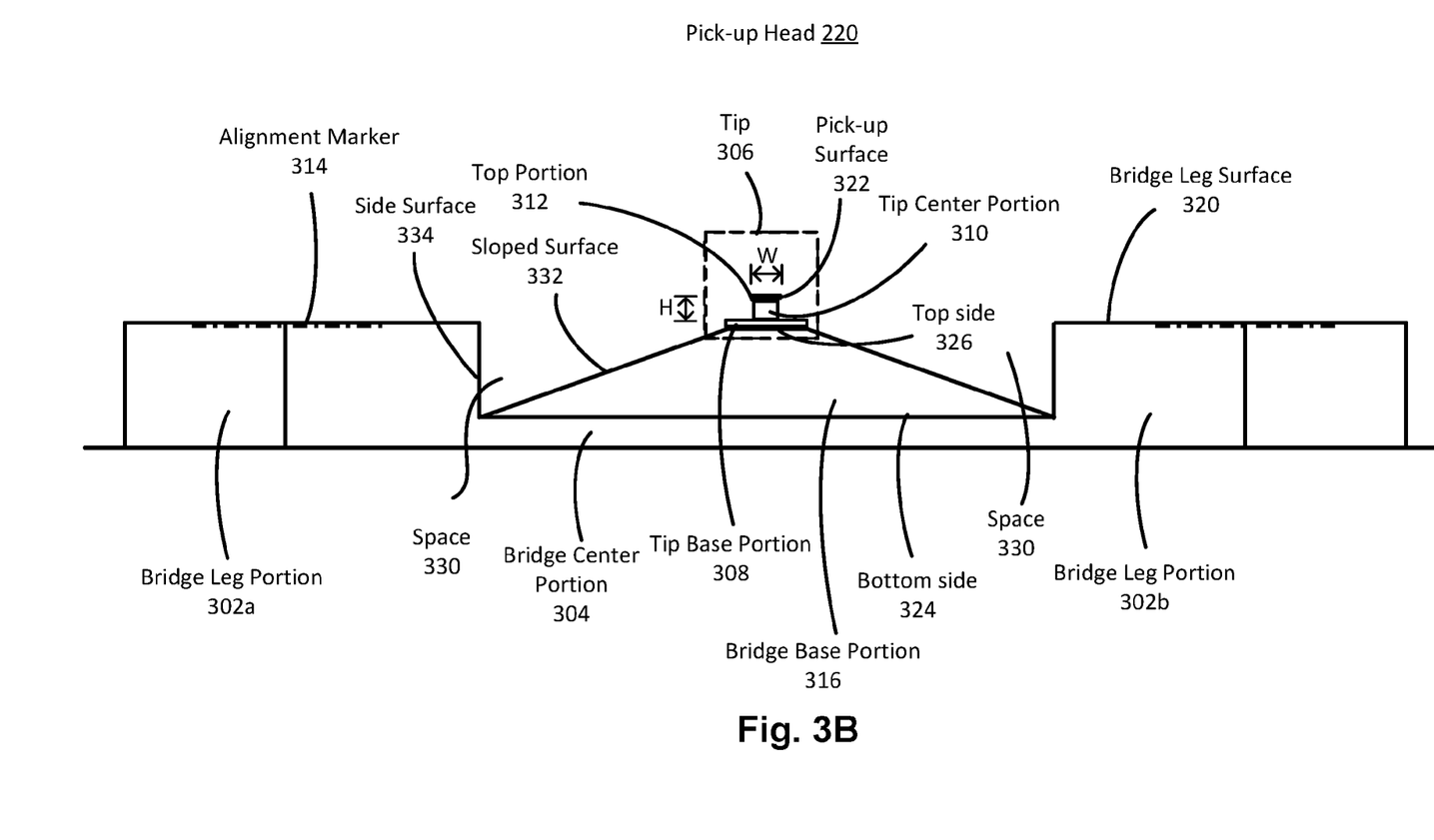
FIG. 3B is a diagram illustrating a side view of the pick-up head, in accordance with one embodiment.

FIG. 3A is a diagram illustrating a perspective view of a pick-up head 220, in accordance with one embodiment. FIG. 3B is a diagram illustrating a side view of the pick-up head 220, in accordance with one embodiment. The pick-up head 220 includes a bridge leg portion 302a, a bridge leg portion 302b, a bridge base portion 316 between the bridge leg portions 302a and 302b, and a tip 306 on the bridge base portion 316.

The tip 306 engages with a semiconductor device transferred by the pick-up head 220. The tip 306 includes a tip base portion 308 arranged on the bridge base portion 316, a tip center portion 310 on the tip base portion 308, and a tip top portion 312 on the tip center portion 310. The tip top portion 312 includes a pick-up surface 322 that attaches to a semiconductor device 112. The tip top portion 312 and the tip center portion 310 form a pedestal mushroom shape, with the width of the tip top portion 312 being wider than the width of the tip center portion 310 as shown in FIGS. 3A and 3B. In some embodiments, multiple tips 306 may be located on the bridge base portion 316.

The bridge leg portions 302a and 302b each includes a bridge leg surface 320. Each bridge leg surface 320 may include one or more alignment markers 314 to facilitate alignment of the pick-up head 220 during transfer operations. For example, the alignment markers 314 increase bonding accuracy of a semiconductor device 112 to a target substrate 118 during a bonding cycle. In some embodiments, alignment markers 314 are defined by recesses in the bridge leg surface 320.

Figure 4:
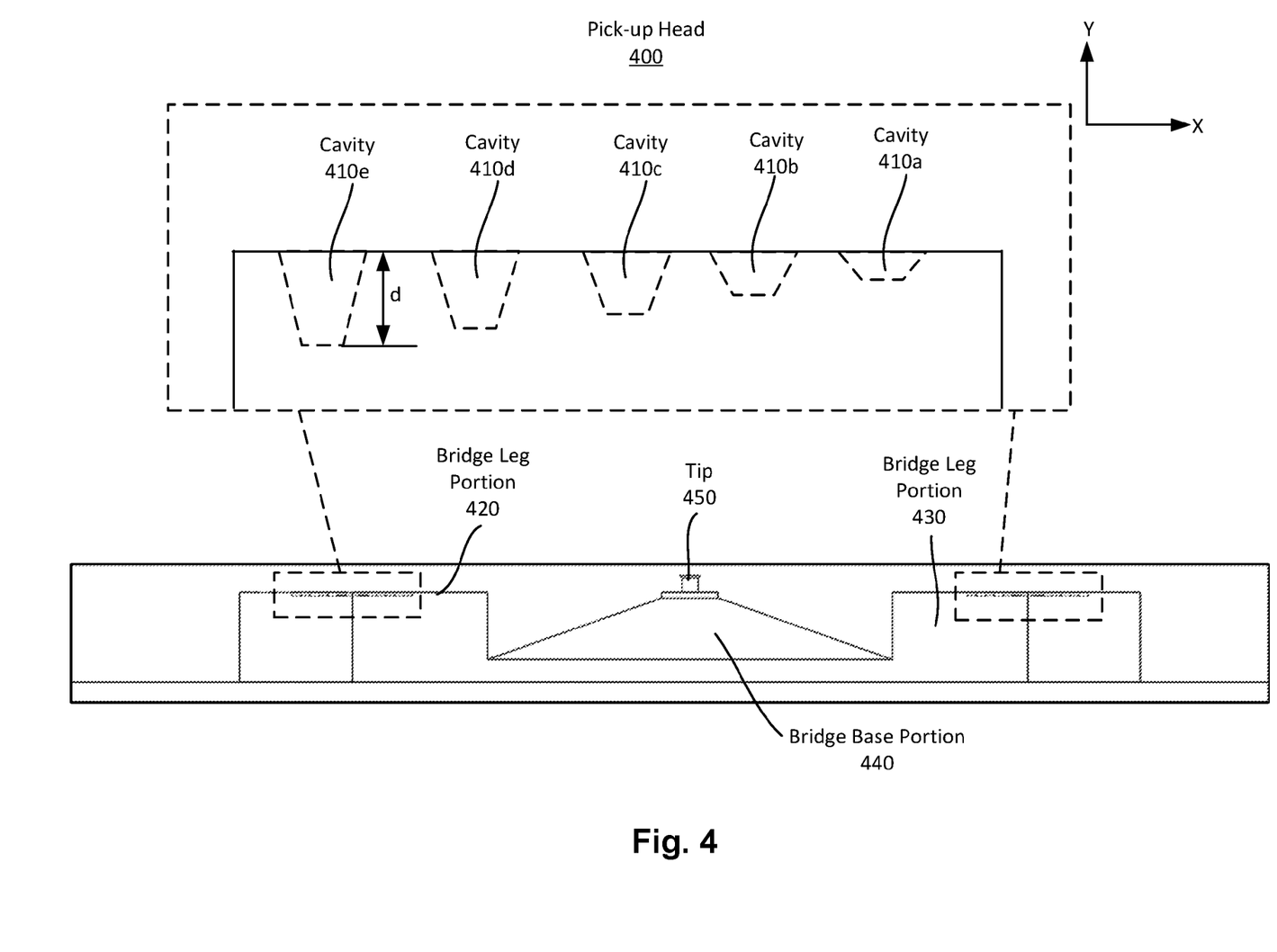
FIG. 4 is a diagram illustrating a side view of a pick-up head formed with a deformable structure for detecting force applied by the pick-up head, in accordance with one embodiment.

The bridge base portion 316 is between the bridge leg portions 302a and 302b. As shown in FIG. 4, the bridge base portion 316 has a bottom side 324 and a top side 326, with the bottom side being larger than the top side 326, and one or more sloped surfaces 332 defined by between the bottom side 324 and the top side 326. The bridge base portion 316 may include a pyramidal, conic, or other sloped shape. Spaces 330 are defined between the one or more sloped surfaces 332 of the bridge base portion 316 and the (e.g., unsloped) side surface of the 334 of the bridge leg portions 302a and 304b. The spaces 330 prevent contact with nearby semiconductor devices 112 during pick or place operations. During a bonding cycle, the spaces 330 prevent contact or shearing with semiconductor devices 112 previously bonded to the target substrate.

In some embodiments, the pick-up head 220 may be manufactured using a 3D printing process and a subsequent double molding step process. This allows for manufacture of the pick-up head 220 with sub-micrometer features, and tuning of stress distribution during the bonding of semiconductor devices 112 to the target substrate 118.

FIG. 4 is a diagram illustrating a side view of a pick-up head 400 formed with a deformable structure for detecting force applied by the pick-up head 400, in accordance with one embodiment. The pick-up head 400 may transfer a semiconductor device from a carrier substrate to a target substrate. The pick-up head 400 includes a bridge leg portion 420, a bridge leg portion 430, a bridge base portion 440 between the bridge leg portions 420 and 430, and a tip 450 on the bridge base portion 440. The pick-up head 400 applies a force on the semiconductor device during the transfer to bond the semiconductor device to the tip and/or the target substrate. In some embodiment, the pick-up head 400 is a component of a PUT that also includes a pick-up head substrate and backing layer, e.g., the pick-up head substrate 210 and the backing layer 230.

The deformable structure deforms under the force applied by the pick-up head 400. In the embodiment of FIG. 4, the deformable structure includes a resilient body with a discrete array of cavities 410a-e (referred collectively as "cavities 410" and individually as "cavity 410") formed in each of the bridge leg portions 420 and 430. As the pick-up head 400 applies the force, the bridge leg portions 420 and 430 are compressed, which changes shapes and/sizes of the cavities 410. For instance, each cavity 410 becomes smaller or even filled up. The amount of deformation of the deformable structure changes with the amount of the force applied by the pick-up head 400. The amount of the force can be determined based on the deformation of the deformable structure and the visco-elastic properties of the material of the pick-up head 400 (e.g., PDMS).

Deformation of the cavities 410 is captured by an imaging device, e.g., the imaging device 108. In some embodiments, the imaging device captures images of the pick-up head 400 or the PUT. The pick-up head substrate and backing layer of the PUT as well as the bridge leg portions 420 and 430 and a bridge base portion 440 of the pick-up head 400 are transparent so that the imaging device can capture light reflected from the deformable structure. A controller (e.g., the controller 106) receives the images captured by the imaging device, determines deformation of the structure in the images, and determines the force applied by the pick-up head 400.

The cavities 410*a*-*e* have different sizes. As shown in FIG. 4, each cavity 410 has a different depth d along a Y direction. The cavities 410*a*-*e* have increasing depth. The depth of the cavity 410*a* is the smallest, e.g., 1 μm, and the depth of the cavity 410*e* is the largest, e.g., 6 μm. A stronger force is required to fill up a cavity 410 having a larger depth.

In some embodiments, the depth of each cavity 410 is determined based on a respective pre-defined amount of force, such as an amount of force that is required in a transfer process or a step in a transfer process. In response to the cavity 410*a* being filled up, the controller can determine that the pick-up head 400 applies the corresponding pre-defined amount of force.

In some embodiments, the controller 106 instructs the pick-up head 400 (or a pick-up head actuator driving the pick-up head 400) to adjust the applied force based on the determined force. For example, in response to the cavity 410*a* not being filled up, the controller 106 determines that the force applied by the pick-up head 400 is not strong enough to pick up the corresponding type of semiconductor device, and instructs the pick-up head 400 or the pick-up head actuator to apply a stronger force. As another example, in response to the cavities 410*a* and 410*b* both being filled up, the controller determines that the force applied by the pick-up head 400 is stronger than the force needed to pick up the type of semiconductor device corresponding to the cavity 410*a*. The controller can instruct the pick-up head 400 or the pick-up head actuator to apply a weaker force.

In some embodiments, the depths of the cavities 410 are determined based on pre-defined forces required for various steps of a transfer process. More details of such a transfer process are described below in conjunction with FIG. 6.

In FIG. 4, each cavity 410 has a frustoconical shape. In other embodiments, the cavities 410 can have a different shape, such as semi-sphere, or different shapes. Also, each bridge leg portion can be formed with less or more than five cavities. And one of the bridge leg portions 420 and 430 may not be formed with any cavities.

Figure 5A:
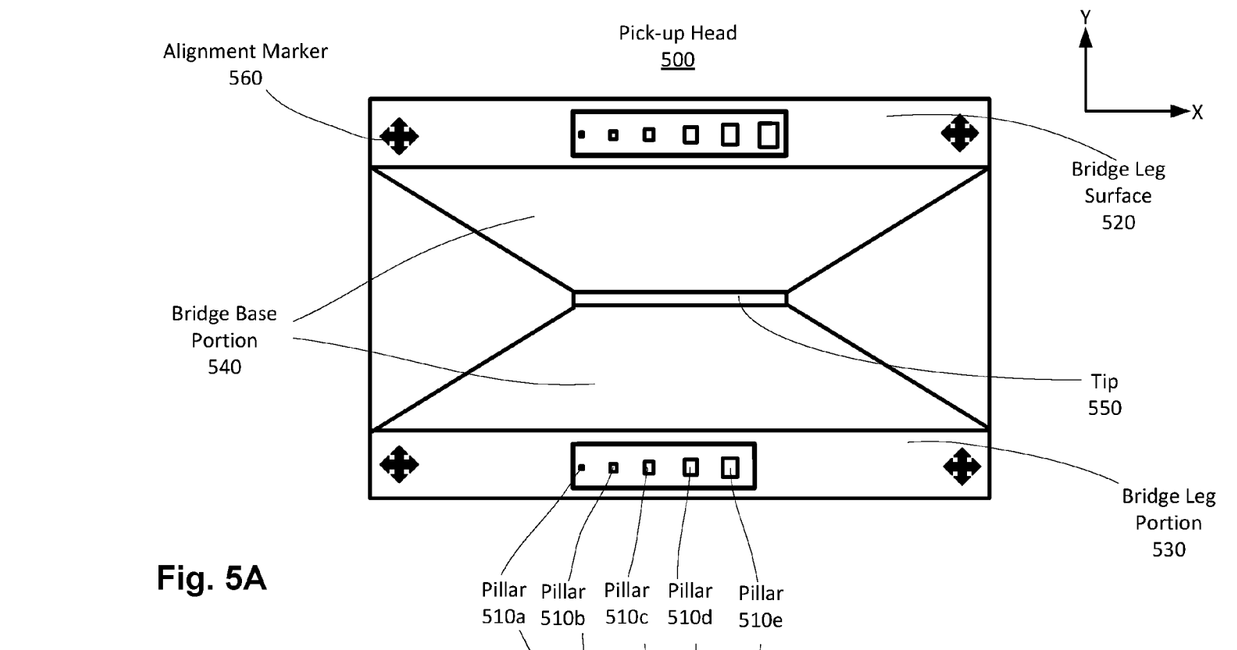
FIG. 5A is a diagram illustrating a top view of a pick-up head formed with another deformable structure for detecting force applied by the pick-up head, in accordance with one embodiment.
Figure 5B:
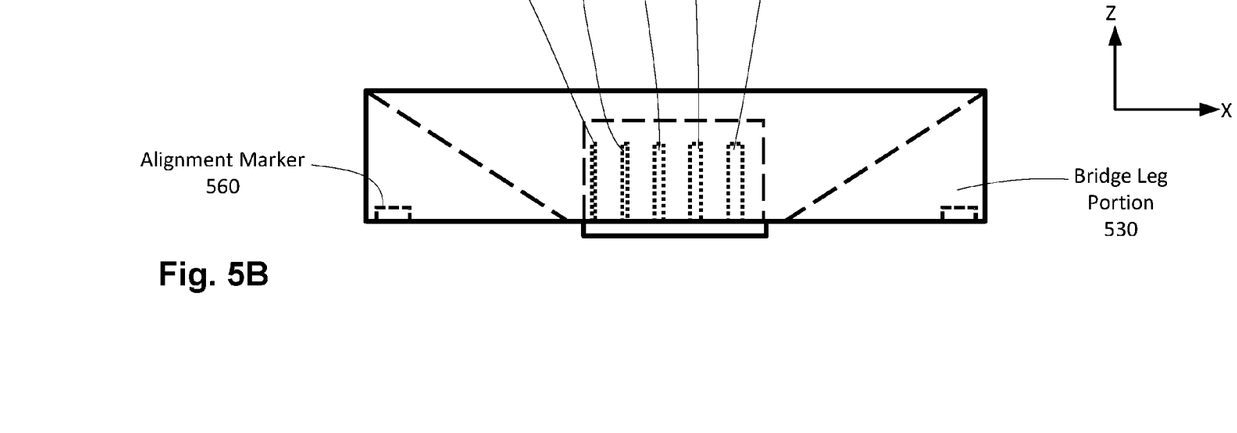
FIG. 5B is a diagram illustrating a side view of the pick-up head in FIG. 5A, in accordance with one embodiment.

FIG. 5A is a diagram illustrating a top view of a pick-up head 500 formed with another deformable structure for detecting force applied by the pick-up head 500, in accordance with one embodiment. FIG. 5B is a diagram illustrating a side view of the pick-up head 500 in FIG. 5A, in accordance with one embodiment. The pick-up head 500 transfers a semiconductor device from a carrier substrate to a target substrate. During the transfer, the pick-up head 500 applies a force on the semiconductor device to bond the semiconductor device. The pick-up head 500 includes a first bridge leg portion 520, a second bridge leg portion 530, alignment markers on the bridge leg portions 520 and 530, a bridge base portion 540 between the first and second bridge leg portions 520 and 530, and a tip 550 on the bridge base portion 540.

The deformable structure deforms under the force applied by the pick-up head 500 during the transfer process. In the embodiment of FIG. 5, the deformable structure includes an array of discrete pillars 510*a*-*e* (referred collectively as "pillars 510" and individually as "pillar 510") arranged on each of the bridge leg portions 520 and 530. The pillars 510 can be made of a resilient material so that the pillars 510 can buckle when they are compressed and resume their original shape after being compressed. As the pick-up head 500 applies the force, the bridge leg portions 520 and 530 are compressed, e.g., against the carrier substrate or the target substrate, which causes buckling of at least one pillar 510. The amount of the force can be determined based on the amount of buckling of the at least one pillar 510.

In some embodiments, buckling of the pillars 510 is captured by an imaging device, e.g., the imaging device 108. In some embodiments, the pick-up head 500 is attached on a transparent backing layer and a transparent pick-up head substrate, such as a backing layer and pick-up head substrate made of PDMS. The bridge leg portions 520 and 530 are also transparent, so that the imaging device can capture light reflected from the pillars 510. A controller (e.g., the controller 106) receives one or more images captured by the imaging devices, analyzes the deformation of the pillars 510, and determines the force applied by the pick-up head 500 based on the deformation.

The pillars 510 have different cross-sectional area in the X-Y plane. The pillars 510*a*-*e* have decreasing cross-sectional areas, for example, the cross-sectional area of the pillar 510*a* is the smallest, and the cross-sectional area of the pillar 510*e* is the largest. A stronger force is required to cause the buckling of a pillar 510 having a larger cross-sectional area.

In some embodiments, the cross-sectional area of each pillar 510 is determined based on a respective pre-defined amount of force, such as an amount of force that is sufficient to pick up a particular type of semiconductor device. For instance, in response to the buckling of a pillar 510, the controller can determine that the pick-up head 500 applies at least the corresponding pre-defined amount of force and can pick up the corresponding type of semiconductor device. In response to the pillar 510*a* not buckling, the controller can determine that the force applied by the pick-up head 500 is not strong enough to pick up the corresponding type of semiconductor device. The controller can also instruct a pick-up head actuator, e.g., the pick-up head actuator 122, to cause the pick-up head 500 to apply a stronger force. In some embodiments, the cross-sectional areas of the pillars 410 are determined based on pre-defined forces required for various steps of a bonding process.

In FIG. 5, each pillar 510 has a cuboid shape. In other embodiments, the pillars 510 can have a different shape, such as cylinder, or different shapes. Also, each bridge leg portion can be formed with less or more than six pillars. And one of the bridge leg portions 520 and 530 may not be formed with any pillar.

Figure 6:
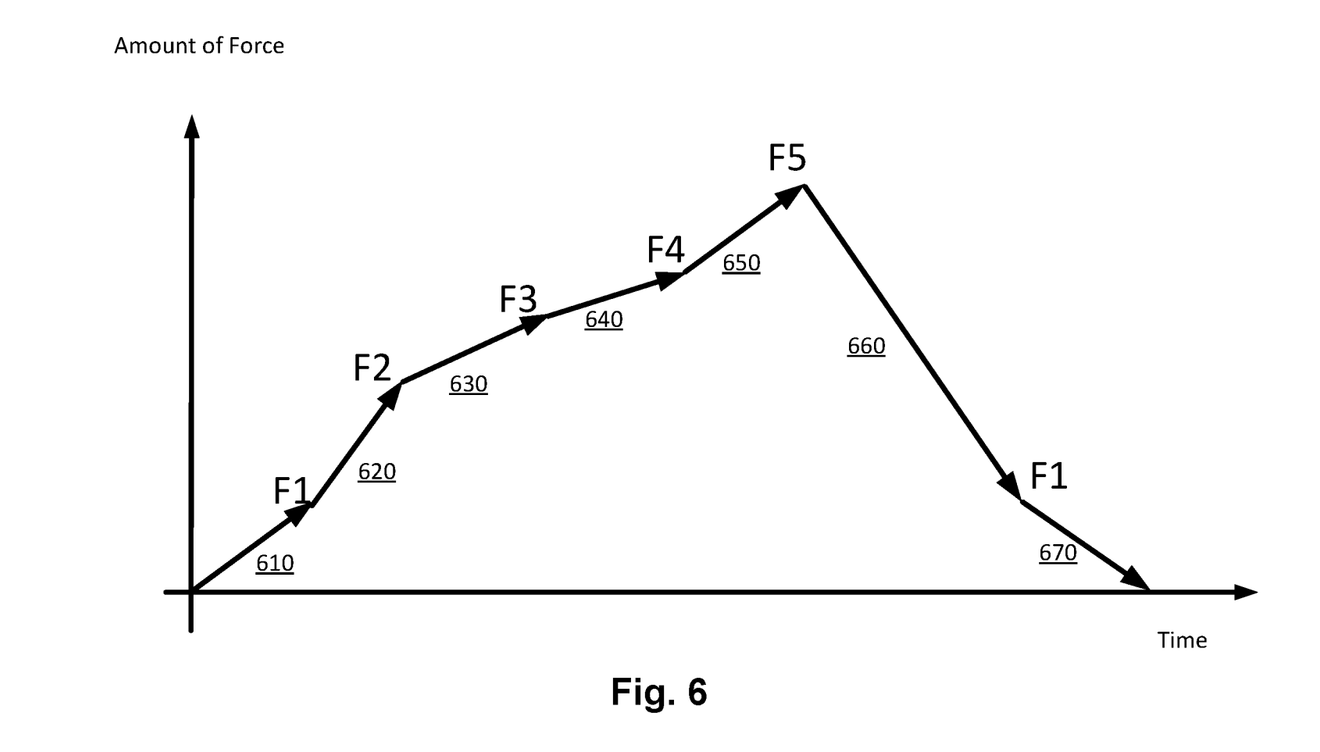
FIG. 6 is a diagram illustrating a transfer process of a pick-up head transferring a semiconductor device that includes various steps in which the PUT applies different forces, in accordance with one embodiment.

FIG. 6 is a diagram illustrating a transfer process of a pick-up head transferring a semiconductor device that includes various steps 610 through 670 in which the PUT applies different forces, in accordance with one embodiment. FIG. 6 includes a plot showing amount of force as a function of time. The transfer process includes the seven steps 610 through 670. The steps 610 through 650 requires forces F1 through F5, respectively. Taking the pick-up head 400 as an example, the depths of the cavities 410 are determined based on the forces F1 through F5, respectively. In each step, the controller can instruct the pick-up head 400 (or the pick-up head actuator) to apply a force to fill up the corresponding cavity 410. Taking the pick-up head 500 as another example, the cross-sectional areas of the pillars 510 are determined based on the forces F1 through F5, respectively. In each step, t the controller can instruct the pick-up head 500 (or the pick-up head actuator) to apply a force to cause buckling of the corresponding pillar 510.

In the step 660, the amount of force is dropped to the force F1 and the pick-up head 400 or 500 can be instructed to apply a force to either fill up the cavity 410*a* or cause buckling of the pillar 510*a*. In the step 670, the amount of force is further dropped to zero and the pick-up head 400 or 500 is instructed to apply no force.

Figure 7A:
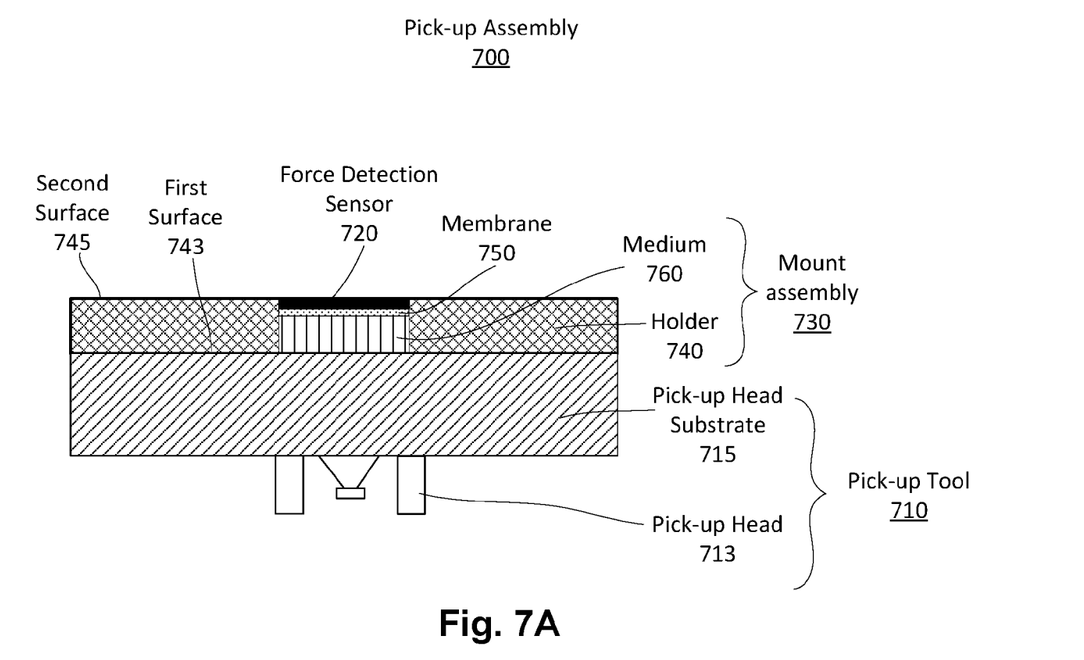
FIG. 7A is a diagram illustrating a top view of a pick-up assembly, in accordance with one embodiment.
Figure 7B:
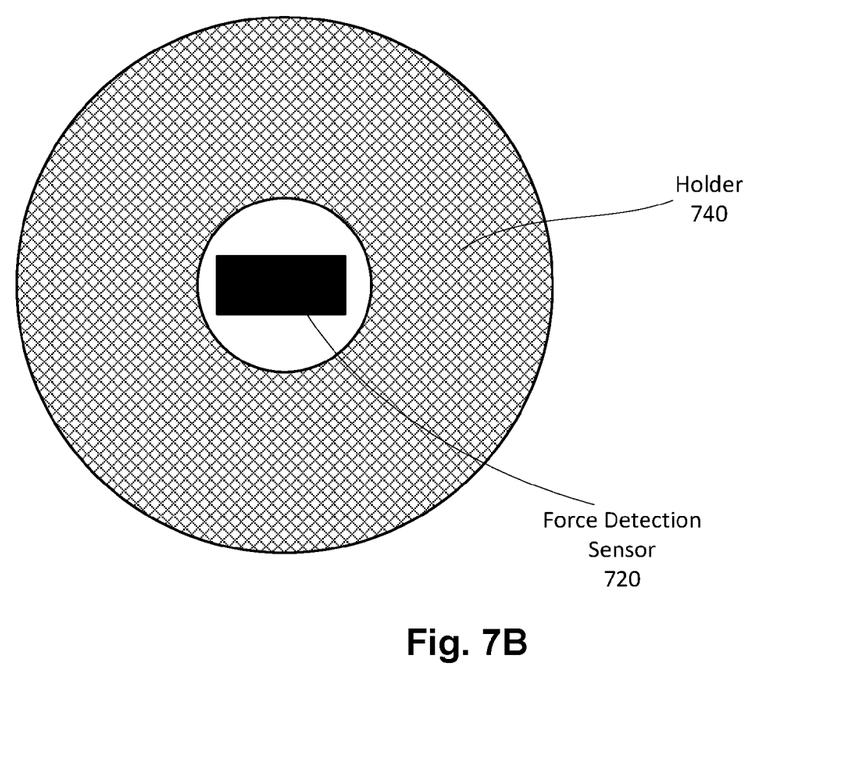
FIG. 7B is a diagram illustrating a front view of the pick-up assembly, in accordance with one embodiment.

FIG. 7A is a diagram illustrating a top view of a pick-up assembly 700, in accordance with one embodiment. FIG. 7B is a diagram illustrating a front view of the pick-up assembly 700, in accordance with one embodiment. The pick-up assembly 700 includes a PUT 710, a force detection sensor 720, and a mount assembly 730.

The PUT 710 transfers a semiconductor device from a carrier substrate to a target substrate. The PUT 710 includes a pick-up head 713 and a pick-up head substrate 715. The PUT 710 applies a force on the semiconductor device during the transfer for bonding the semiconductor device to the pick-up head 713 and/or the target substrate. In some embodiments, the PUT 710 also includes a backing layer that is attached on the pick-up head substrate 715 and the pick-up head 713 is mounted on the backing layer. An embodiment of the PUT 710 is the PUT 200 described above.

The force detection sensor 720 detects the force applied by the PUT 710. In some embodiments, the force detection sensor 720 includes a piezoresistive sensor or a strain gauge whose electrical resistance changes with force applied on it. The force detection sensor 720 can be coupled to a processing device (not shown in FIGS. 7A and 7B). The process device can receive a sensing signal from the force detection sensor 720 and process the sensing signal to determine the force applied by the PUT 710.

The process device can also determine a target sensing signal based on a pre-defined force that the PUT 810 is required to apply. The process device can instruct the PUT 810 or an actuator coupled to the PUT 810 (e.g., the pick-up head actuator 122) to adjust the force until the process device receives the target sensing signal. The process device can be part of a controller coupled to the PUT 810, e.g., the controller 106

The mount assembly 730 mounts the force detection sensor 720 onto the PUT 710. The mount assembly 730 includes a holder 740, a membrane 750, and a medium 760. The holder 740 includes a first surface 743 and a second surface 745 at an opposite side of the first surface 733. The pick-up head substrate 715 of the PUT 710 is attached to the first surface 743 of the holder 740. The holder 740 is formed with a hole and the hole on or under the second surface of the holder 740 is covered by the membrane 750. The force detection sensor 720 is attached on the membrane 750. The medium 760 is in the hole and located between the PUT 710 and the membrane 750. In some embodiments, the holder 740 is made of glass, the membrane 750 is made of polydimethylsiloxane (PDMS), and the medium 760 is air or PDMS.

Figure 8:
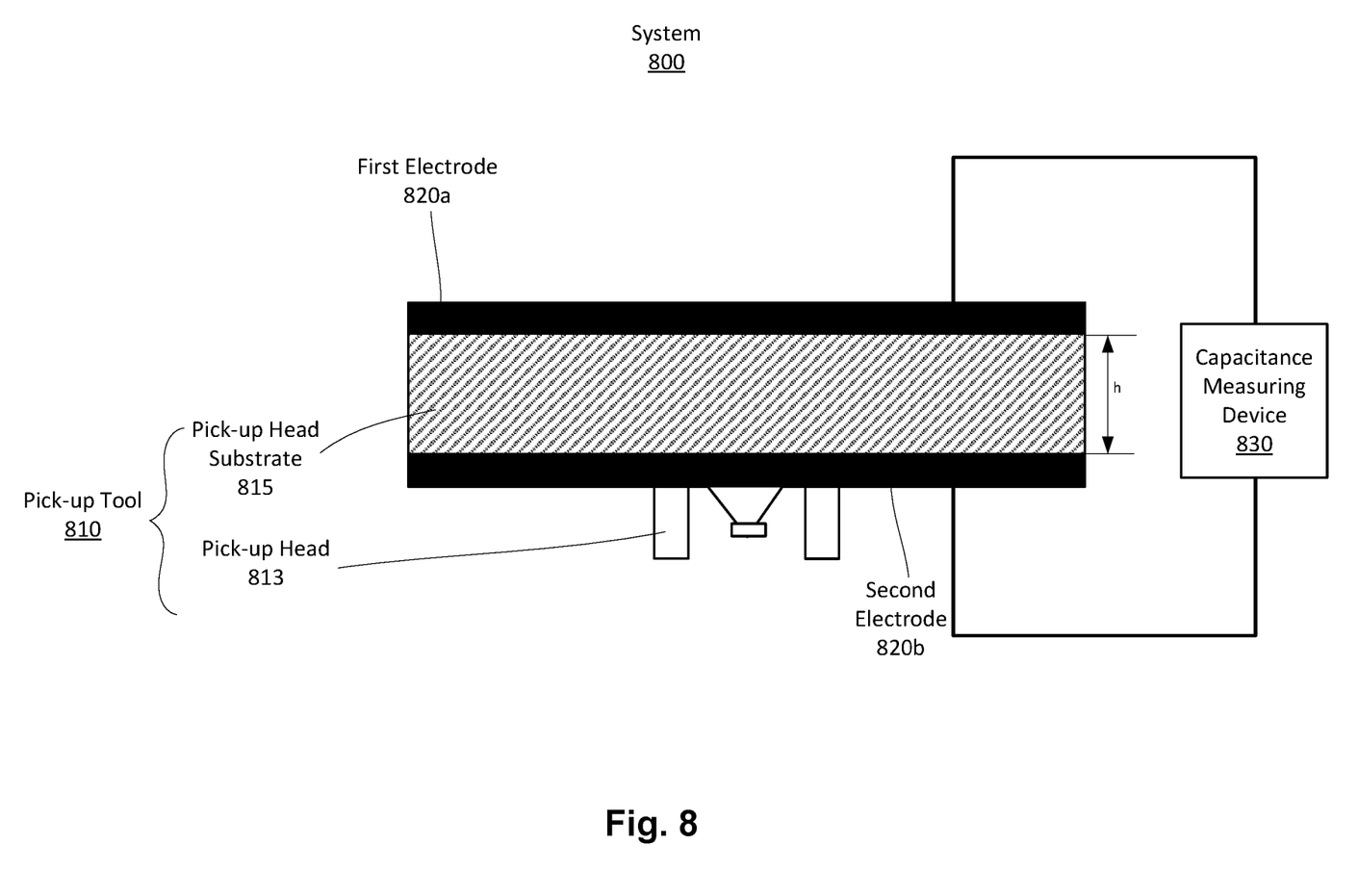
FIG. 8 is a schematic view of a system including a PUT and a force detection device, in accordance with one embodiment.

FIG. 8 is a schematic view of a system 800 including a PUT 810 and a force detection device, in accordance with one embodiment. The PUT 810 transfers a semiconductor device from a carrier substrate to a target substrate. The PUT 810 includes a pick-up head 813 and a pick-up head substrate 815. An embodiment of the PUT 810 is the PUT 200 described above. The PUT 810 applies a force on the semiconductor device for bonding the semiconductor device to the pick-up head 813 and/or the target substrate.

The force detection device detects the force applied by the PUT 810. The force detection device includes a first electrode 820a, a second electrode 820b, and a capacitance measuring device 830. The first electrode 820a is mounted on a surface of the pick-up head substrate 815. The second electrode 820b is mounted on another surface of the pick-up head substrate 815 that opposes the surface on which the first electrode 820a is mounted. The capacitance measuring device 830 is connected to the first and second electrodes 820a and 820b and measures a capacitance between the first and second electrodes 820a and 820b.

A controller coupled to the PUT 810, e.g., the controller 106, can determine the force applied by the PUT 810 based on the measured capacitance. The measured capacitance is related to a distance between the first and second electrodes 820a and 820b, i.e., a height h of the pick-up head substrate 815. Under the force applied by the PUT 810, the height h of the pick-up head substrate 815 changes, and therefore, the capacitance changes. Accordingly, the applied force can be determined based on the change in the capacitance. For this purpose, the capacitance measuring device 830 may emit current or voltage signals to one or both of the electrodes 820a, 820b, and sense the changes in the current or voltage level with the progress of time.

The controller can also determine a target capacitance based on a pre-defined force that the PUT 810 is required to apply. The controller can instruct the PUT 810 or an actuator coupled to the PUT 810 (e.g., the pick-up head actuator 122) to adjust the force it applies to meet the target capacitance.

Figure 9A:
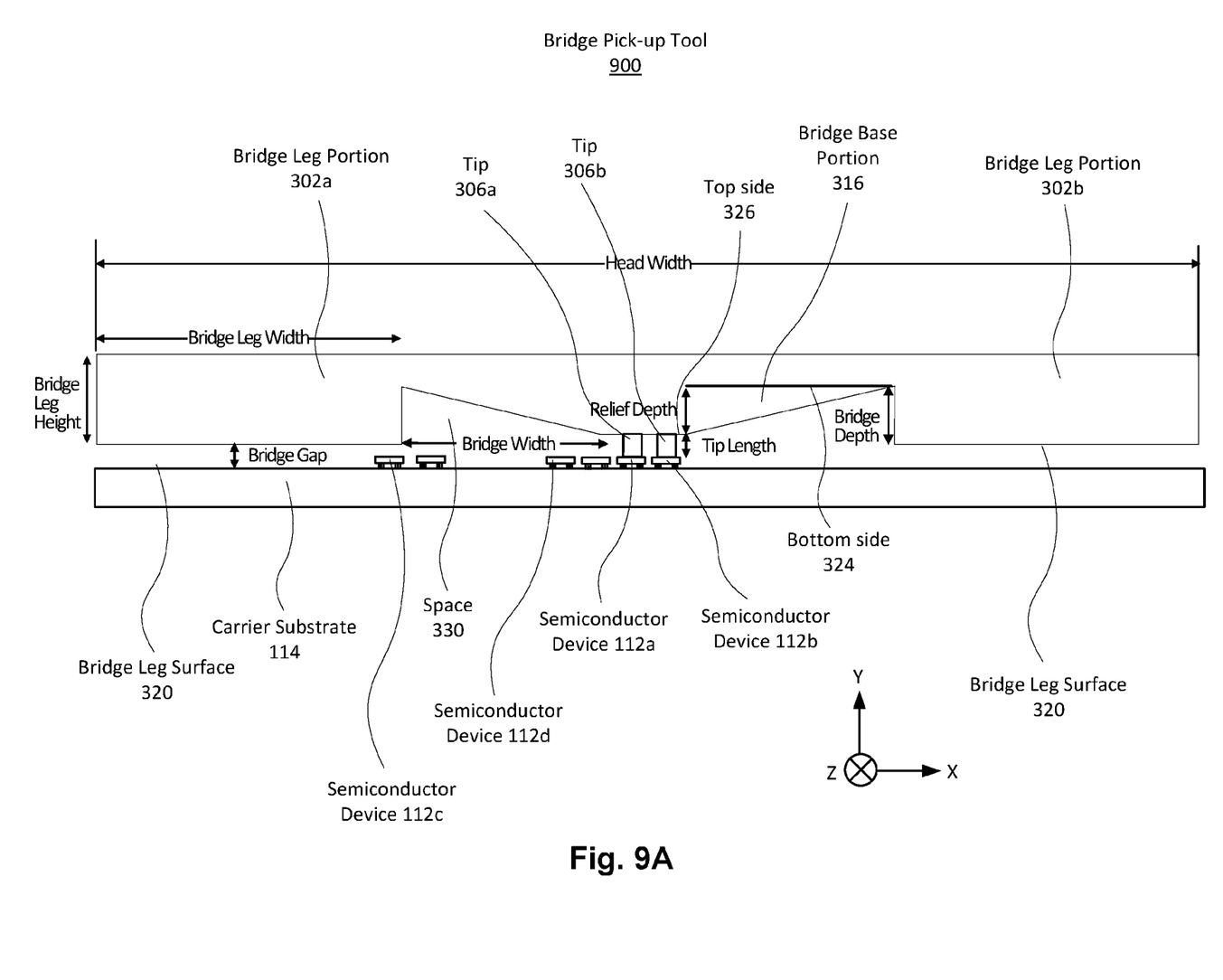
FIG. 9A is a diagram illustrating pickup of semiconductor devices using a PUT, in accordance with one embodiment.

FIG. 9A is a diagram illustrating pickup of semiconductor devices 112a and 112b using a PUT 900, in accordance with one embodiment. The PUT 900 is like the PUT 200, but includes multiple tips 306a and 306b attached to the bridge base portion 316.

The PUT 900 picks up the semiconductor devices 112a and 112b from the carrier substrate 114, places the semiconductor devices 112a and 112b on the target substrate 118, and bonds the contacts of the semiconductor devices 112a and 112b to contacts 602 of the target substrate 118.

As shown in FIG. 9A, the PUT 900 picks up the semiconductor devices 112a and 112b from the carrier substrate 114 by contacting the semiconductor devices 112a and 112b with the tips 306a and 306b, respectively. The contact between each tip 306 and a semiconductor device 112 results in an adhesive attachment. In some embodiments, an elastomeric layer is formed on the semiconductor device 112 to facilitate the attachment.

In some embodiments, the PUT 900 applies a force on the semiconductor devices 112a and 112b to bond the semiconductor devices 112a and 112b to the tips 306a and 306b. The force can be detected or controlled as described above.

A light contact between the tip 306 and the semiconductor device 112 may be sufficient to achieve the attachment, and thus there is little or no deformation in the PUT 900 during the pick-up. The PUT 900 is at a rest state or close to a rest state. In the rest state, the tips 306 of the PUT 900 extend beyond the bridge leg portions 302a and 302b. A bridge gap is defined between the bridge leg portions 302a and 302b the carrier substrate 114. The bridge gap prevents contact with a non-selected semiconductor devices 112c on the carrier substrate 114. Furthermore, a space 330 defined by a bridge depth (defined from the bridge leg surface 320 to the joint of the bridge leg portion 302 at the bottom side 324 of the bridge base portion 316) and a bridge width (defined from end of the top side 326 to the joint of the bridge leg portion 302) prevents contact with a non-selected semiconductor device 112d on the carrier substrate 114 near the selected semiconductor devices 112a and 112.

Once the semiconductor devices 112a and 112b are attached to the PUT 900, the PUT 900 may be separated from the carrier substrate 114 (e.g., lifted along the Y-axis) to remove the semiconductor devices 112a and 112b from the carrier substrate 114.

Figure 9B:
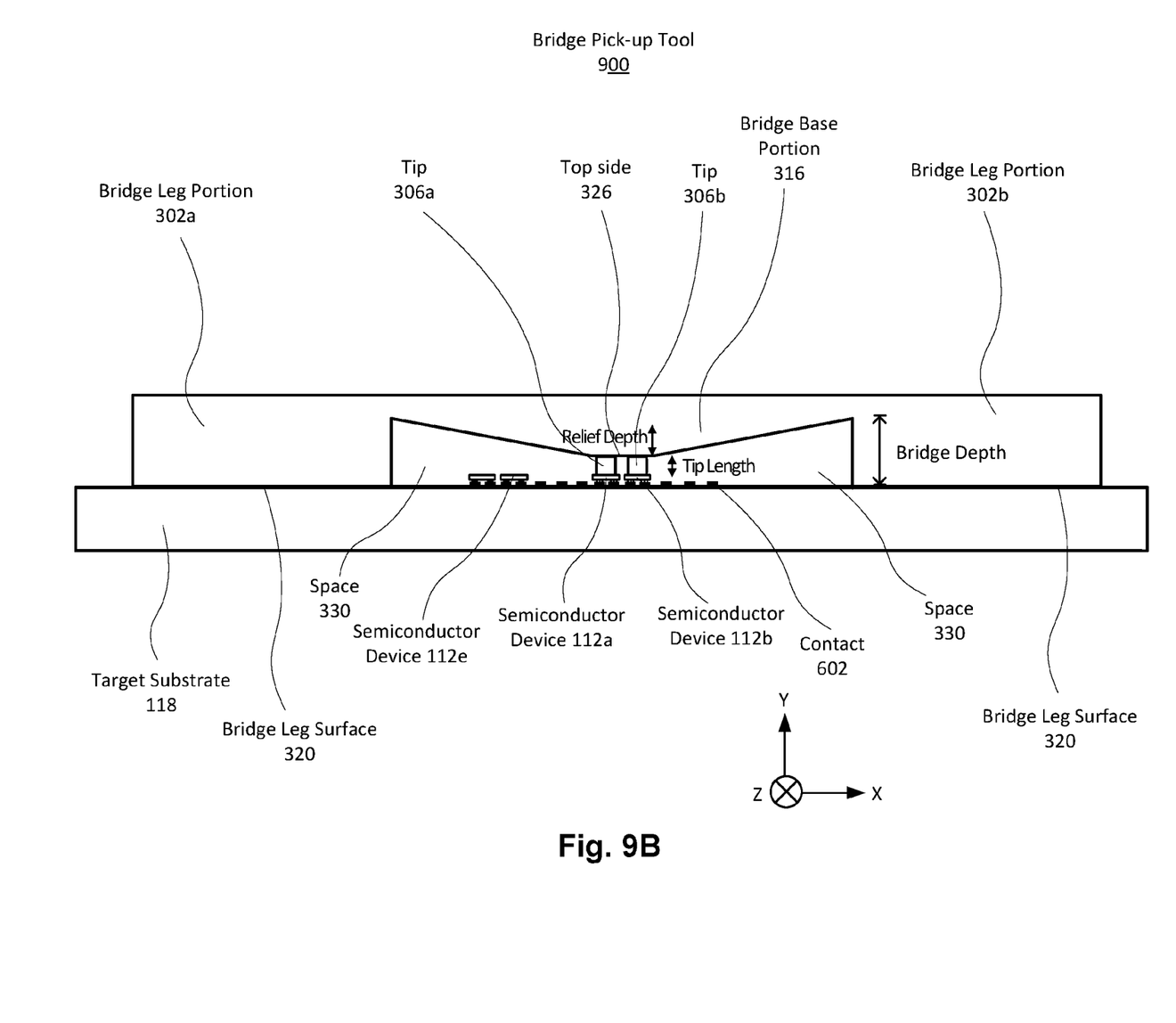
FIG. 9B is a diagram illustrating a placement and bonding of the semiconductor devices using the PUT, in accordance with one embodiment.

FIG. 9B is a diagram illustrating a placement and bonding of the semiconductor devices 112a and 112b using the PUT 900, in accordance with one embodiment. The PUT 900 attached with the semiconductor devices 112a and 112b are aligned with target locations on the target substrate 118. The contacts of the semiconductor devices 112a and 112b are placed on contacts 602 of the target substrate 118.

The bonding process may include thermocompression bonding, laser assisted bonding, or applying pressure, with force being applied on the semiconductor devices 112a and 112b toward the target substrate 118 by the PUT 900 (e.g., along the Y axis). The applied force results in the PUT 900 being in a compressed state as shown in FIG. 9B, with the bridge base portion 316 and/or tips 306 being compressed (e.g., reducing the relief depth and/or tip length), and the bridge leg surface 320 of each bridge leg portion 302a and 302b contacting the target substrate 118. The applied force can be detected or controller as described above. While the compression is applied by the PUT 900, heat may be applied (e.g., by the target stage 120 that holds the target substrate 118) to perform the thermocompression bonding. The thermocompression bonding results in the contacts of the semiconductor devices 112a and 112b being bonded to the contacts 602 of the target substrate 118.

The contact between the bridge leg portion 302a and 302b and the target substrate 118 reduces relative lateral motion (along X-Z plane) between the PUT 900 and the target substrate 118, and holds the semiconductor devices 112a and 112b in place. The bridge leg portion 302a and 302b act as anchor points by adhering to the target substrate 118. To adhere the bridge leg portion 302a and 302b to the target substrate 118, a load (also referred to as a preload) is applied by the PUT 900 to push the bridge leg portions 302a and 302b against the target substrate 118 until the bridge leg surfaces 320 of the surface of the bridge leg portions 302a and 302b contact the target substrate 118 (bridge gap = 0).

In the rest state shown in FIG. 9A, the tips 306 extends below the bridge leg portions 302a and 302b to prevent contact with the carrier substrate 114 or semiconductor devices 112 that are not to be picked up. Otherwise, there is a chance that a bridge leg portion 302a or 302b would unintentionally pick up a semiconductor device. In the compressed state shown in FIG. 9B, the bridge leg portions 302 and 302b extend below the tips 306 to allow the bridge leg surfaces 320 to contact the target substrate 118.

The PUT 900 defines space 330 between the bridge leg portion 302a and the tip 306a, and another space 330 between the bridge leg portion 302b and the tip 306b. The space 330 prevents contact with or shearing of previously bonded semiconductor devices, such as the semiconductor device 112e. In some embodiments, the bridge depth may be greater than 30 um, such as 60 um.

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A pick-up tool comprising:
a first leg portion;
a second leg portion;
a bridge base portion between the first and second leg portions, the bridge base portion having a first sloped surface connected to the first leg portion, and a second sloped surface connected to the second leg portion;
a tip mounted on the bridge base portion between the first sloped surface and the second sloped surface, the tip configured to engage with a semiconductor device for picking up the semiconductor device from a carrier substrate; and
a deformable structure configured to detect a force applied by the pick-up tool on the semiconductor device, the deformable structure formed within at least one of the first leg portion and the second leg portion of the pick-up tool and configured to deform under the force.

2. The pick-up tool of claim 1, wherein deformation of the deformable structure is detected by an imaging device configured to capture one or more images of the pick-up tool.

3. The pick-up tool of claim 2, further comprising a pick-up head substrate and a backing layer on which the first leg portion, the second leg portion, and the bridge base portion are attached, wherein the pick-up head substrate, the backing layer, the first leg portion, the second leg portion, and the bridge base portion are transparent to light so that the imaging device can capture light reflected from the deformable structure to capture the one or more images.

4. The pick-up tool of claim 3, wherein the pick-up head substrate and backing layer are made of polydimethylsiloxane (PDMS).

5. The pick-up tool of claim 1, wherein the deformable structure is a resilient body with at least one cavity formed in the first leg portion or the second leg portion.

6. The pick-up tool of claim 5, wherein the cavity has a shape of a cone or semi-sphere.

7. The pick-up tool of claim 5, wherein the deformable structure comprises a plurality of discrete cavities, the discrete cavities having different depths and comprising the at least one cavity.

8. The pick-up tool of claim 1, wherein the deformable structure comprises a pillar of a resilient material arranged on the pick-up tool, and the force causes buckling of the pillar.

9. The pick-up tool of claim 1, wherein the deformable structure comprises a plurality of pillars of one or more resilient materials, each of the pillars having a different height.

10. A pick-up assembly comprising:
a pick-up tool configured to engage with a semiconductor device for transferring the semiconductor, the pick-up tool comprising:
a first leg portion;
a second leg portion;
a bridge base portion between the first and second leg portions, the bridge base portion having a first sloped surface connected to the first leg portion, and a second sloped surface connected to the second leg portion; and
a tip mounted on the bridge base portion between the first sloped surface and the second sloped surface, the tip configured to engage with a semiconductor device for picking up the semiconductor device from a carrier substrate;

a mount assembly having a first surface and a second surface at an opposite side of the first surface, the pick-up tool attached to the first surface; and a force detection sensor on or under the second surface of the mount assembly.

11. The pick-up assembly of claim 10, wherein the force detection sensor comprises a piezoresistive sensor or a strain gauge.

12. The pick-up assembly of claim 10, wherein the mount assembly further comprises:

a holder formed with a hole; and a membrane arranged in the hole, the force detection sensor attached on the membrane.

13. The pick-up assembly of claim 12, wherein the membrane is made of polydimethylsiloxane (PDMS) and the holder is made of glass.

14. The pick-up assembly of claim 12, wherein the mount assembly further comprises:

a medium located between the membrane and the pick-up tool, the medium configured to push the membrane onto the holder by a compression force.

15. The pick-up assembly of claim 14, wherein the medium is air or PDMS.

16. A system, comprising:

a pick-up tool configured to transfer a light emitting diode (LED), the pick-up tool comprising:

a first leg portion, a second leg portion, a bridge base portion between the first and second leg portions, the bridge base portion having a first sloped surface connected to the first leg portion, and a second sloped surface connected to the second leg portion, and a tip mounted on the bridge base between the first sloped surface and the second sloped surface, the tip portion configured to engage with the LED for transferring the LED; and a force detection device configured to detect a force applied by the pick-up tool on the LED.

17. The system of claim 16, wherein a deformable structure is formed within at least one of the first leg portion and the second leg portion of the pick-up tool; and wherein the force detection device comprises:

an imaging device configured to capture one or more images of the deformable structure, and a controller configured to:

receive the one or more images, analyze deformation of the deformable structure based on the one or more images, and determine the force applied by the pick-up tool based on the deformation.

18. The system of claim 16, wherein the force detection device comprises:

a piezoresistive sensor or a strain gauge on or in a mounting assembly on which the pick-up tool is mounted; and a processing device configured to:

receive a sensing signal from the piezoresistive sensor or the strain gauge, and process the sensing signal to determine the force applied by the pick-up tool.

19. The system of claim 16, wherein the force detection device comprises:

a first electrode on a first surface of a substrate of the pick-up tool;

a second electrode on a second surface of the substrate of the pick-up tool, the second surface of the substrate opposing the first surface of the substrate;

a capacitance measuring device configured to measure a capacitance between the first electrode and the second electrode; and a controller configured to determine the force based on the capacitance.

* * * * *